United States Patent
Imhof et al.

(10) Patent No.: US 12,379,406 B2
(45) Date of Patent: Aug. 5, 2025

(54) ELECTROMETER WITH RADIO FREQUENCY TUNING SIGNAL

(71) Applicant: NORTHROP GRUMMAN SYSTEMS CORPORATION, Falls Church, VA (US)

(72) Inventors: Eric A. Imhof, Albuquerque, NM (US); Steven Ryan Jefferts, Chatsworth, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 196 days.

(21) Appl. No.: 18/357,867

(22) Filed: Jul. 24, 2023

(65) Prior Publication Data

US 2024/0241162 A1   Jul. 18, 2024

Related U.S. Application Data

(60) Provisional application No. 63/439,525, filed on Jan. 17, 2023.

(51) Int. Cl.
*G01R 29/08* (2006.01)
*G01R 29/14* (2006.01)

(52) U.S. Cl.
CPC ......... *G01R 29/0885* (2013.01); *G01R 29/14* (2013.01)

(58) Field of Classification Search
CPC ............................ G01R 29/12; G01R 29/0885
USPC ......................................................... 324/457
See application file for complete search history.

(56) References Cited

U.S. PATENT DOCUMENTS

| | | | | |
|---|---|---|---|---|
| 4,147,979 A | * | 4/1979 | Baues | G01R 9/12 |
| | | | | 386/12 |
| 2016/0363617 A1 | * | 12/2016 | Anderson | G01R 29/0885 |
| 2019/0072600 A1 | * | 3/2019 | Schubert | H01S 5/0657 |
| 2022/0196444 A1 | | 6/2022 | Imhof et al. | |

FOREIGN PATENT DOCUMENTS

| | | |
|---|---|---|
| WO | 2022/133091 A1 | 6/2022 |
| WO | 2022-197507 | 9/2022 |

OTHER PUBLICATIONS

WOISR: "Written Opinion and International Search Report" mailed Apr. 22, 2024 for corresponding PCT/US2023/084289.

* cited by examiner

*Primary Examiner* — Christopher P McAndrew
(74) *Attorney, Agent, or Firm* — Tarolli, Sundheim, Covell & Tummino LLP (57) ABSTRACT

One example includes an electrometer system. The system includes a sensor cell comprising alkali metal atoms within, and an optical beam system configured to provide at least one optical beam through the sensor cell to provide a first Rydberg energy state of the alkali metal atoms, the at least one optical beam exiting the sensor cell as a detection beam. The system also includes a radio frequency (RF) tuning field generator configured to generate an RF tuning signal having a tuning frequency that is equal to an energy difference between the first Rydberg energy state and a second Rydberg energy state of the alkali metal atoms. The system further includes a detection system configured to monitor the detection beam to detect an external signal having a frequency that is between the first and second Rydberg energy states.

20 Claims, 4 Drawing Sheets

ELECTROMETER WITH RADIO FREQUENCY TUNING SIGNAL

RELATED APPLICATIONS

This application claims priority from U.S. Patent Application Ser. No. 63/439,525, filed 17 Jan. 2023, which is incorporated herein in its entirety.

GOVERNMENT INTEREST

The invention was made under Government Contract. Therefore, the US Government has rights to the invention as specified in that contract.

TECHNICAL FIELD

The present invention relates generally to sensor systems, and specifically to an electrometer with radio frequency (RF) tuning signal.

BACKGROUND

Electric field measurement via electrometers has many useful applications. Detectable electric fields can include DC electric fields, as well as AC electric fields (e.g., radio frequency (RF) fields which can correspond to communications signals). The detection of electric fields can be implemented for anti-spoofing and/or anti-jamming capability in electronic warfare environments. For example, if a jamming or spoofing signal can be detected, then the jamming signal or spoofing signal can be filtered or demodulated out to provide for a baseband signal of interest without undesired or adversarial interference. As an example, multiple antennas arranged in an array can provide for directional detection of a signal, such as to provide a detectable directional of a source of the signal.

SUMMARY

One example includes an electrometer system. The system includes a sensor cell comprising alkali metal atoms within, and an optical beam system configured to provide at least one optical beam through the sensor cell to provide a first Rydberg energy state of the alkali metal atoms, the at least one optical beam exiting the sensor cell as a detection beam. The system also includes a radio frequency (RF) tuning field generator configured to generate an RF tuning signal having a tuning frequency that is equal to an energy difference between the first Rydberg energy state and a second Rydberg energy state of the alkali metal atoms. The system further includes a detection system configured to monitor the detection beam to detect an external signal having a frequency that is between the first and second Rydberg energy states.

Another example includes method for detecting an external signal via an electrometer system. The method includes directing a probe beam through a sensor cell comprising an alkali metal atoms in a first direction. The probe beam can exit the sensor cell as a detection beam. The method also includes directing a coupling beam through the sensor cell to provide a first Rydberg energy state of the alkali metal atoms based on the probe beam and the coupling beam. The method also includes providing an RF tuning signal through the sensor cell. The RF tuning signal can have a tuning frequency that is equal to an energy difference between the first Rydberg energy state and a second Rydberg energy state of the alkali metal atoms. The method further includes monitoring the detection beam to detect the external signal having a frequency that is between the first and second Rydberg energy states.

Another example includes an electrometer system. The system includes a sensor cell comprising alkali metal atoms within. The system also includes a probe laser configured to provide a probe beam through the sensor cell in a first direction along a length of the sensor cell, the probe beam exiting the sensor cell as a detection beam, and a coupling laser configured to provide a coupling beam through the sensor cell to provide a first Rydberg energy state of the alkali metal atoms based on the probe beam and the coupling beam. The system also includes an RF tuning field generator configured to generate an RF tuning signal having a tuning frequency that is equal to an energy difference between the first Rydberg energy state and a second Rydberg energy state of the alkali metal atoms and has a wavelength that is greater than twice the length of the sensor cell. The system further includes a detection system configured to monitor the detection beam to detect an external signal having a frequency that is between the first and second Rydberg energy states.

DETAILED DESCRIPTION

The present invention relates generally to sensor systems, and specifically to an electrometer with optical Rydberg frequency tuning. The electrometer system can include a sensor cell containing a vapor of alkali metal atoms enclosed within. The electrometer system also includes a probe laser and a coupling laser that are configured to generate a probe beam and a coupling beam, respectively. Each of the probe beam and the coupling beam can be provided through the sensor cell via a set of optics. The probe beam and coupling beams can take any mutually intersecting path through the sensor cell, including but not limited to paths in which the probe beam and the coupling beams are arranged collinearly and anti-parallel with each other. The probe beam may exit the sensor cell traveling in the opposite direction as the coupling beams. After exiting the sensor cell, the probe beam can be isolated and interrogated as a detection beam. The probe beam and the coupling beam can be tuned to respective frequencies and powers to excite certain atoms within the alkali metal vapor to a first Rydberg energy state. The number and properties of atoms in this first Rydberg energy state can be determined by measuring the power and phase of the detection beam. For example, if the power of the detection beam plotted as a function of detection beam frequency, a peak of transmitted light can be detected for frequencies corresponding to the excitation of the first Rydberg energy state.

The electrometer system also includes an RF tuning signal generator configured to generate an RF tuning signal that is likewise provided through the sensor cell. As an example, the RF tuning signal can be provided along the length of the sensor cell in a same direction as one of the probe beam or the coupling beam, such as along a waveguide that is arranged internally or externally with respect to the sensor cell. The RF tuning signal can have a frequency that corresponds to an energy difference between the first Rydberg energy state and a second Rydberg energy state. There are many possible choices for the first and second Rydberg states, such that the RF tuning signal can have frequencies over a broad range from 10 MHz to 100 GHz. As an example, the Rydberg states can be selected such that the RF tuning signal wavelength is approximately twice the length of the sensor cell or greater, such as to ensure all atoms in the cell experience the same time-averaged RF tuning signal strength. As a result, the formation of standing wave patterns from reflections with the cell surfaces with respect to the RF tuning signal can be mitigated. For example, the resulting tuning signal has a frequency of approximately 1-10 GHz for nominal dimensions of the sensor cell.

The electrometer system further includes a detection system configured to monitor the detection beam to detect the strength of the RF tuning signal between the first and second Rydberg energy states. The detection system can include a photodetector that can monitor an intensity and/or phase of the detection beam. For example, if the RF tuning signal frequency corresponds to the energy difference between the first and second Rydberg energy states, then a new set of mixed energy states is generated. The mixed energy states are a linear combination of the first and second Rydberg energy states. The energies of these mixed states can be determined by scanning the frequency of the probe beam and observing the frequencies of maximal transparency of the probe beam. The peak transparencies can be predicted using a Hamiltonian matrix that is associated with the frequency and power of the RF tuning signal.

The detection system can be further configured to detect the strength of an external RF signal with a frequency substantially less than or more than the energy difference between the first and second Rydberg states. In the absence of the RF tuning signal, the external RF signal would generate minimal mixing between the Rydberg states. As a result, the frequencies of maximal probe beam transparency would be substantially unchanged. However, the provided RF tuning signal creates mixed states that can be further modified by the external RF signal. Thus, the external RF signal strength has a large effect on the frequencies of maximal probe beam transparency.

As an example, the external RF signal can have a frequency detuning substantially less than or more than the energy difference between the first and second Rydberg states and the RF tuning field can have zero frequency detuning between the first and second Rydberg states. The electrometer system can thus demonstrate an especially strong response to the external RF signal strength if the external RF signal detuning is equal to half of the Rabi frequency of the RF tuning signal. The Hamiltonian describing the condition of the strong response to the external RF signal strength if the external RF signal detuning is equal to half of the Rabi frequency of the RF tuning signal can be similar to the Hamiltonian for a conventional method of detecting external RF signals with substantial de-tunings. The conventional method implements an RF tuning signal with zero detuning between the first and second Rydberg states to determine the external RF signal having a large detuning between the first Rydberg state and a third Rydberg state. However, systems that implement the conventional method often use RF tuning signals with high frequencies. The high frequency RF tuning signal can cause the RF tuning signal to create standing waves of field strength throughout the sensor cell. As a result, alkali atoms at different locations within the cell can have Rydberg states mixed by different amounts. As a result, the subsequent state mixing caused by the external RF signal can become difficult to differentiate.

By contrast, the electrometer system described herein can be implemented to detect external signals having a relatively low frequency to provide for greater uniformity of the RF tuning signal in the sensor cell, thereby mitigating deleterious coupling of the RF tuning signal with other Rydberg energy states.

Figure 1:
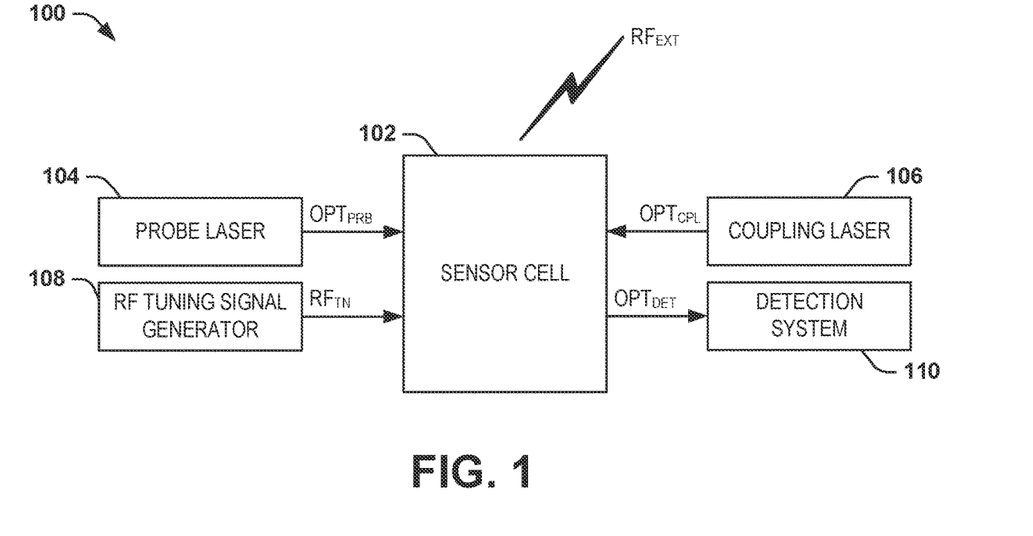
FIG. 1 illustrates an example block diagram of an electrometer system.

FIG. 1 illustrates an example block diagram of an electrometer system 100. The electrometer system 100 can be implemented in any of a variety of applications, such as to detect an external electromagnetic signal of any frequency (e.g., a radio frequency (RF) signal). In the example of FIG. 1, the external signal is demonstrated as $RF_{EXT}$.

The electrometer system 100 includes a sensor cell 102 that can be configured as a sealed glass container that includes a vapor of alkali metal atoms. As an example, the alkali metal vapor can be rubidium (Rb), or any of a variety of other types of alkali metals (e.g., cesium (Cs)). As described herein, the alkali metal vapor can be excited to a Rydberg energy state, such that the alkali metal vapor can be substantially insensitive to absorption of (e.g., is approximately transparent with respect to) photons of light of a specific frequency. The electrometer system 100 also includes a probe laser 104 that is configured to generate a probe beam $OPT_{PRB}$ and a coupling laser 106 that is configured to generate a coupling beam $OPT_{CPL}$. As an example, each of the probe beam $OPT_{PRB}$ and the coupling beam $OPT_{CPL}$ can be provided through the sensor cell 102 via optics (not shown) in a manner such that the probe beam $OPT_{PRB}$ and the coupling beam $OPT_{CPL}$ can each be collimated (e.g., via optics) and provided collinearly and anti-parallel with respect to each other. However, other arrangements for providing intersection of the probe beam $OPT_{PRB}$ and the coupling beam $OPT_{CPL}$ for stimulating the alkali metal vapor to the Rydberg state can be provided instead.

As an example, the probe beam $OPT_{PRB}$ and the coupling beam $OPT_{CPL}$ can be tuned to respective frequencies to provide a first Rydberg energy state of the alkali metal vapor, such that the alkali metal vapor is excited to populate the first Rydberg energy state. While the example of FIG. 1 demonstrates a single coupling laser 106, multiple coupling lasers can be implemented to provide multiple respective coupling beams $OPT_{CPL}$ of differing frequencies to excite the alkali metal vapor to the first Rydberg energy state, as described herein. The probe beam $OPT_{PRB}$ can exit the sensor cell 102 as a detection beam $OPT_{DET}$.

The electrometer system 100 also includes an RF tuning signal generator 108 configured to generate a RF tuning signal $RF_{TN}$ that is likewise provided through the sensor cell 102. As an example, the RF tuning signal $RF_{TN}$ can be provided along the length of the sensor cell 102 approximately in the direction of the probe beam $OPT_{PRB}$ or the coupling beam $OPT_{CPL}$. The RF tuning signal $RF_{TN}$ can be selected to have a frequency that corresponds to an approximate energy difference between the first Rydberg energy state and a second Rydberg energy state.

As an example, the sensor cell 102 can include a waveguide (e.g., a two-wire waveguide) that is arranged internally or externally with respect to the sensor cell 102 and which is configured to propagate the RF tuning signal $RF_{TN}$. As another example, the RF tuning signal $RF_{TN}$ can be provided at a frequency such that the wavelength of the RF tuning signal $RF_{TN}$ (e.g., the period of the RF tuning signal $RF_{TN}$) can be greater than twice a length of sensor cell 102. As a result, the electric field provided by the RF tuning signal $RF_{TN}$ in the sensor cell 102 can exhibit an approximate uniformity within the sensor cell 102, and thus can affect the alkali metal vapor therein approximately uniformly. Accordingly, the chance of the RF tuning signal $RF_{TN}$ being unintentionally resonant with a different Rydberg energy state (e.g., other than the first and second Rydberg energy states) resulting from standing wave patterns from reflections with the surfaces of the sensor cell 102 can be mitigated. As described in greater detail herein, the relatively lower frequency of the RF tuning signal $RF_{TN}$ can be implemented to detect external signals having a relatively lower frequency.

As described in greater detail herein, the resonance of the RF tuning signal $RF_{TN}$ to the energy difference between the first and second Rydberg energy states can result in generation of mixed energy states that are associated with the first and second Rydberg energy states. The mixed energy states can each be based on a linear combination of the first and second Rydberg energy states. As an example, the RF tuning signal $RF_{TN}$ can be adjusted (e.g., by amplitude) to adjust the energy of the mixed energy states, as described in greater detail herein. Therefore, as described herein, the frequency of the external signal $RF_{EXT}$ can be determined based on the power and frequency of the RF tuning signal $RF_{TN}$. For example, the external signal $RF_{EXT}$ can have a frequency that is less than an energy difference between the first and second Rydberg energy states.

The electrometer system 100 further includes a detection system 110 that is configured to monitor the detection beam $OPT_{DET}$ to detect the external signal $RF_{EXT}$. The detection system 110 can include a photodetector that can monitor an intensity and/or phase of the detection beam $OPT_{DET}$. As described above, the external signal $RF_{EXT}$ can have a frequency that is less than an energy difference between the first and second Rydberg energy states. Therefore, as described herein, the detection system 110 can detect the presence and frequency of the external signal $RF_{EXT}$ relative to the first and second Rydberg energy states based on providing the RF tuning signal $RF_{TN}$ that is resonant with the first and second Rydberg energy states.

Accordingly, the electrometer system 100 can determine the frequency of the external signal $RF_{EXT}$ in a manner similar to a typical electrometer system that implements an RF tuning signal resonant between a first Rydberg energy state and a second Rydberg energy state to determine a frequency of an external signal between the first Rydberg energy state and a third Rydberg energy state. However, as opposed to the typical electrometer system, the electrometer system 100 can determine the frequency of the external signal $RF_{EXT}$ between the first and the second Rydberg energy states based on the RF tuning signal $RF_{TN}$ being resonant with the first and second Rydberg energy states. Therefore, the electrometer system 100 can be implemented to detect external signals having a relatively low frequency (e.g., 1-10 GHz in range) to provide for greater uniformity of the RF tuning signal in the sensor cell, thereby mitigating deleterious coupling of the RF tuning signal with other Rydberg energy states.

Figure 2:
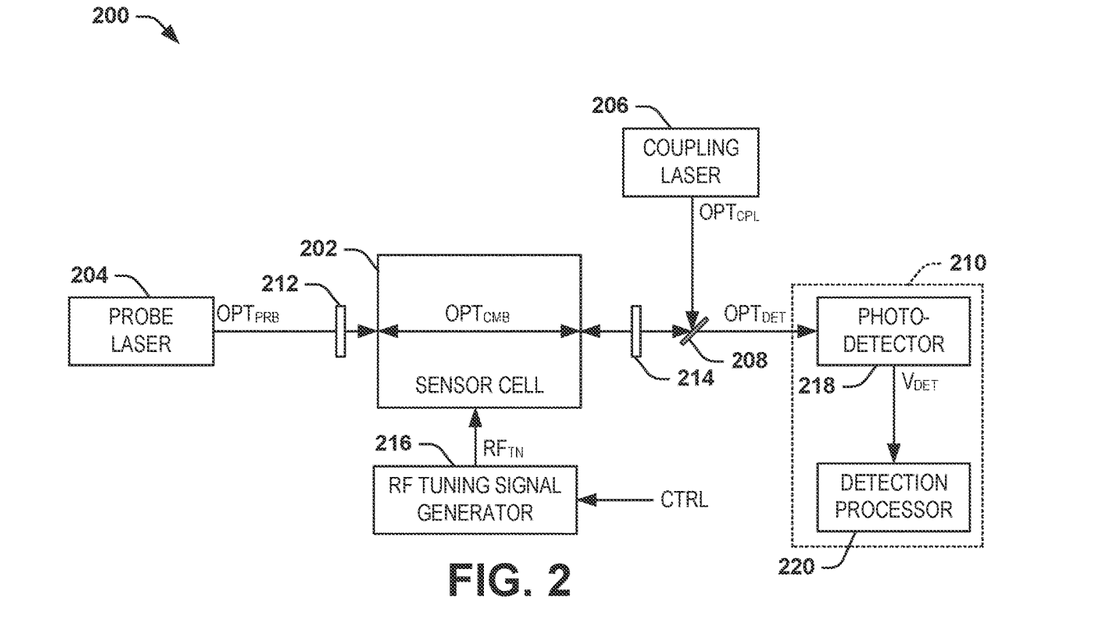
FIG. 2 illustrates an example diagram of an electrometer system.

FIG. 2 illustrates another example diagram of an electrometer system 200. The electrometer system 200 can be implemented in any of a variety of applications in which detection of an external signal $RF_{EXT}$ is desired.

The electrometer system 200 includes a sensor cell 202 that can be configured as a sealed glass container that includes an alkali metal vapor. The electrometer system 200 also includes a probe laser 204 that is configured to generate a probe beam $OPT_{PRB}$ and a coupling laser 206 that is configured to generate a coupling beam $OPT_{CPL}$. The coupling beam $OPT_{CPL}$ is provided to a dichroic mirror 208 that is configured to reflect the coupling beam $OPT_{CPL}$ into the sensor cell 202 and to pass the probe beam $OPT_{PRB}$ through the dichroic mirror 208 as a detection beam $OPT_{DET}$ that is monitored by a detection system 210. The electrometer system 200 includes collimating optics 212 (e.g., a lens) that can collimate the probe beam $OPT_{PRB}$ along a specific axis in the sensor cell 202, and collimating optics 214 (e.g., a lens) that can collimate the coupling beam $OPT_{CPL}$ along the specific axis in the sensor cell 202. Based on the arrangement of the dichroic mirror 208 and collimating optics 212 and 214, the probe beam $OPT_{PRB}$ and the coupling beam $OPT_{CPL}$, and the RF tuning signal $RF_{TN}$ can be provided through the sensor cell 202 in a manner such that the probe beam $OPT_{PRB}$ and the coupling beam $OPT_{CPL}$ are collinear, with the coupling beam $OPT_{CPL}$ being anti-parallel with respect to the probe beam $OPT_{PRB}$, demonstrated in the example of FIG. 2 as a beam $OPT_{CMB}$. Alternatively, the electrometer system 200 can include focusing optics to focus each of the probe beam $OPT_{PRB}$ and the coupling beam $OPT_{CPL}$ to be collocated in the sensor cell 202 at a measurement point.

As described herein, the probe beam $OPT_{PRB}$ and the coupling beam $OPT_{CPL}$ can be tuned to respective frequencies to provide a first Rydberg energy state of the alkali metal vapor. While the example of FIG. 2 demonstrates a single coupling laser 206, multiple coupling lasers can be implemented to provide multiple respective coupling beams $OPT_{CPL}$ of differing frequencies to excite the alkali metal vapor to the first Rydberg state. In addition, the electrometer system 200 includes an RF tuning signal generator 216 configured to generate an RF tuning signal $RF_{TN}$. The RF tuning signal $RF_{TN}$ is provided through the sensor cell 202 (e.g., in a direction parallel with the probe beam $OPT_{PRB}$ and/or the coupling beam $OPT_{CPL}$). The RF tuning signal $RF_{TN}$ can be selected to have a frequency that corresponds to an approximate energy difference between the first Rydberg energy state and a second Rydberg energy state, and is thus resonant with the first and second Rydberg energy states. In the example of FIG. 2, the RF tuning signal generator 216 receives a tuning control signal CTRL that can be implemented to adjust the frequency and amplitude of the RF tuning signal $RF_{TN}$, as described in greater detail herein.

Figure 3:
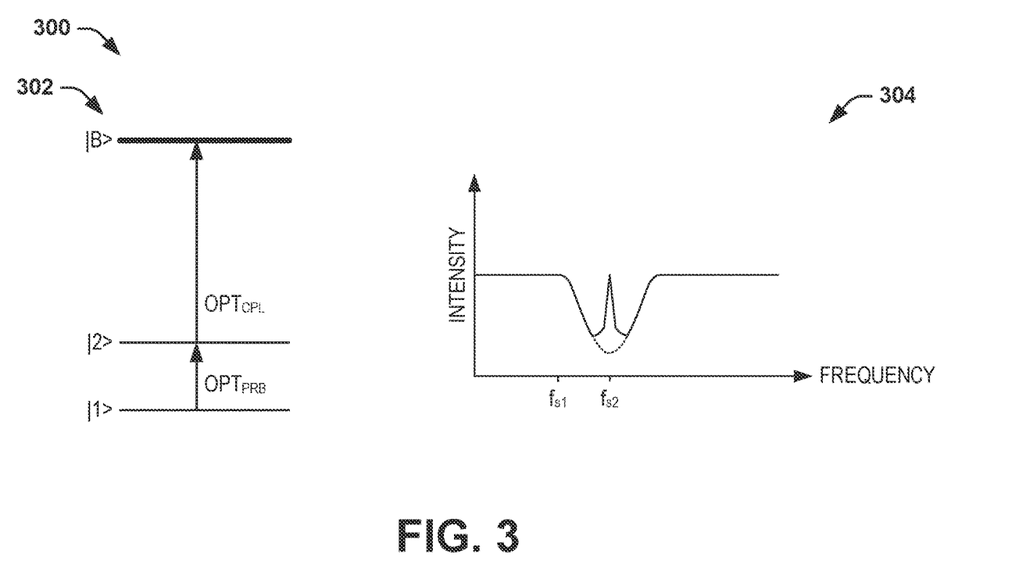
FIG. 3 illustrates an example diagram of optical detection.

FIG. 3 illustrates an example diagram 300 of optical detection. The diagram 300 includes an energy state diagram 302 and a graph 304 that demonstrates intensity of the detection beam $OPT_{DET}$ plotted as a function of frequency. The diagram 300 can correspond to optical detection in the electrometer system 200. Therefore, reference is to be made to the example of FIG. 2 in the following description of the example of FIG. 3.

The energy state diagram 302 demonstrates a first energy state (e.g., ground state) |1> at which the alkali metal atoms can begin. In response to the probe beam $OPT_{PRB}$, a population of the alkali metal atoms can be excited to a first excited state |2>. In response to the coupling beam $OPT_{CPL}$, a population of the excited alkali metal atoms can be further excited to a first Rydberg energy state |B>. Therefore, the alkali metal atoms in the first Rydberg energy state |B> can be transparent with respect to light at the approximate frequency of the probe beam $OPT_{PRB}$.

The graph 304 demonstrates that, at lower frequencies, the intensity of the detection beam $OPT_{DET}$ is at approximately 100%, corresponding to substantially no absorption of photons of the probe beam $OPT_{PRB}$ by the alkali metal vapor. The intensity begins to decrease at a frequency $f_{s1}$ to an absorption peak at a frequency $f_{s2}$ corresponding to maximum absorption of the photons of the probe beam $OPT_{PRB}$ by the alkali metal vapor, and thus a minimum intensity of the detection beam $OPT_{DET}$. The minimum intensity is demonstrated at an inverse peak dotted line in the example of FIG. 3, which would correspond to maximum absorption of the photons of the probe beam $OPT_{PRB}$ absent the coupling beam $OPT_{CPL}$. However, due to the coupling beam $OPT_{CPL}$, provided at a specific frequency and/or polarization with respect to the frequency of the probe beam $OPT_{PRB}$, the alkali metal vapor can experience a Rydberg transition, such that the alkali metal vapor can be substantially insensitive to absorption of the photons of the probe beam $OPT_{PRB}$ at the maximum absorption frequency $f_{s2}$. Therefore, the graph 304 demonstrates an intensity peak at the maximum absorption frequency $f_{s2}$.

Figure 4:
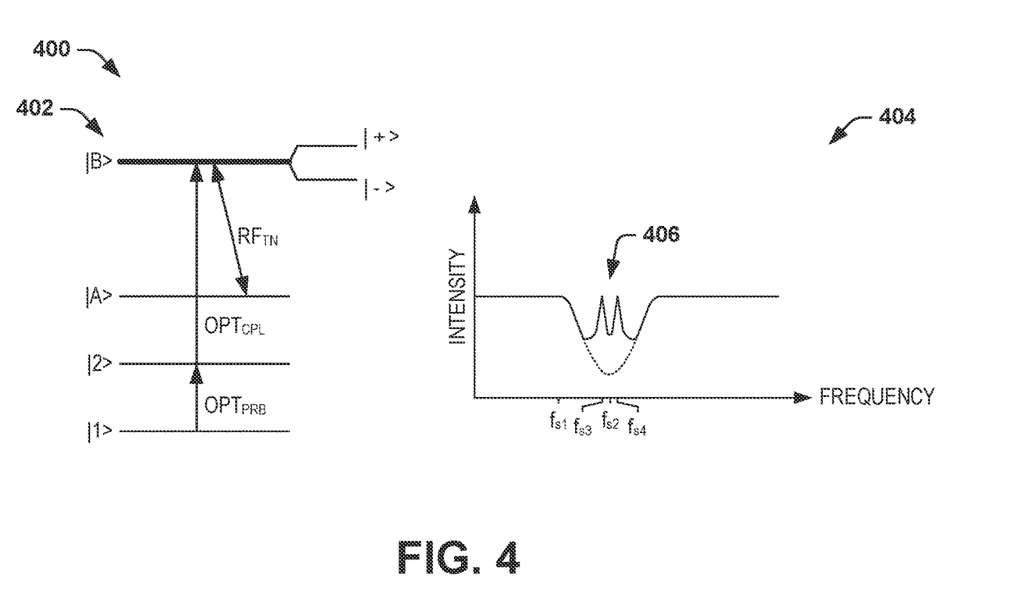
FIG. 4 illustrates another example diagram of optical detection.

FIG. 4 illustrates another example diagram 400 of optical detection. The diagram 400 includes an energy state diagram 402 and a graph 404 that demonstrates intensity of the detection beam $OPT_{DET}$ plotted as a function of frequency. The diagram 400 can correspond to optical detection in the electrometer system 200. Therefore, reference is to be made to the example of FIG. 2 in the following description of the example of FIG. 4.

The energy state diagram 402 is similar to the energy state diagram 302 in the example of FIG. 3. Particularly, the energy state diagram 402 demonstrates a first energy state (e.g., ground state) |1> at which the alkali metal atoms can begin. In response to the probe beam $OPT_{PRB}$, a population of the alkali metal atoms can be excited to a first excited state |2>. In response to the coupling beam $OPT_{CPL}$, a population of the excited alkali metal atoms can be further excited to a first Rydberg energy state |B>. Therefore, the alkali metal atoms in the first Rydberg energy state |B> can be transparent with respect to light at the approximate frequency of the probe beam $OPT_{PRB}$.

However, example of FIG. 4 demonstrates the inclusion of the RF tuning signal $RF_{TN}$ provided through the sensor cell 202. In the example of FIG. 4, the RF tuning signal $RF_{TN}$ has a frequency that is approximately equal to an energy difference between the first Rydberg energy state |B> and a second Rydberg energy state |A>. As an example, the second Rydberg energy state |A> can have an energy that is significantly less than the first Rydberg energy state |B>. Therefore, the RF tuning signal $RF_{TN}$ can have a relatively large frequency, such as greater than a predefined threshold, as described in greater detail below.

In the example of FIG. 4, providing the RF tuning signal $RF_{TN}$ can result in the creation of mixed energy states |+> and |−> that can each be based on a combination of the first and second Rydberg energy states. For example, the mixed energy state |+> can be based on a sum of the first and second Rydberg energy states, as modified by a coefficient, and the mixed energy state |−> can be based on a difference of the first and second Rydberg energy states, as modified by a coefficient. The mixed energy states |+> and |−> are created proximal to (e.g., approximately centered on) the energy level of the first Rydberg energy state |B>. In the graph 404, the mixed energy states |+> and |−> result in Autler-Townes splitting of the transparency peak of the alkali metal atoms in the frequency spectrum. Thus, the transparency peak demonstrated in the graph 304 in the example of FIG. 3 is split into a pair of Autler-Townes transparency peaks, demonstrated at 406, based on the creation of mixed energy states |+> and |−> resulting from the resonance of the RF tuning signal $RF_{TN}$ relative to the energy difference between the first and second Rydberg energy states |B> and |A>. As described herein, the Autler-Townes pair of transparency peaks in the frequency spectrum can be well defined and detectable.

The graph 404 plots an intensity of the detection beam $OPT_{DET}$ as a function of frequency. In the example of FIG. 4, the graph 404 demonstrates an intensity of approximately 100% of the intensity of the detection beam $OPT_{DET}$, and thus substantially no absorption of photons of the probe beam $OPT_{PRB}$ by the alkali metal vapor. The intensity begins to decrease at a frequency $f_{s1}$ to an absorption peak at a frequency $f_{s2}$ corresponding to maximum absorption of the photons of the probe beam $OPT_{PRB}$ by the alkali metal vapor, and thus a minimum intensity of the detection beam $OPT_{DET}$. The minimum intensity is demonstrated at an inverse peak dotted line in the example of FIG. 4, which would correspond to maximum absorption of the photons of the probe beam $OPT_{PRB}$ absent the coupling beam $OPT_{CPL}$. However, based on the interaction of the alkali metal vapor with the probe beam $OPT_{PRB}$, the coupling beam $OPT_{CPL}$, and the RF tuning signal $RF_{TN}$, the alkali metal vapor can exhibit transitions between the mixed energy states |+> and |−> and the second Rydberg state |A>. Therefore, the alkali metal vapor can be substantially insensitive to absorption of the photons of the probe beam $OPT_{PRB}$ at each of two frequencies $f_{s3}$ and $f_{s4}$ that are approximately equal and opposite the maximum absorption frequency $f_{s2}$ on the frequency spectrum.

The diagram 400 thus demonstrates the effect of Autler-Townes splitting of the electromagnetically-induced transparency peak in response to the RF tuning signal $RF_{TN}$ having a frequency that is approximately equal to the energy difference between the first Rydberg energy state |B> and the second Rydberg energy state |A>. As an example, the RF tuning signal $RF_{TN}$ can be tuned (e.g., by frequency or intensity) via the RF tuning signal $RF_{TN}$ to adjust the mixed energy states |+> and |−>. As a first example, by adjusting the frequency of the RF tuning signal $RF_{TN}$ to detune the RF tuning signal $RF_{TN}$ from the energy difference between the first and second Rydberg energy states |B> and |A>, the mixed energy states |+> and |−> can be shifted up or down in the energy diagram. As a second example, by adjusting the intensity of the RF tuning signal $RF_{TN}$, the mixed energy states |+> and |−> can remain approximately centered on the first Rydberg energy state |B>, but the energy gap between the mixed energy states |+> and |−> can be increased or decreased. Accordingly, as described in greater detail herein, by adjusting the RF tuning signal $RF_{TN}$, an external signal $RF_{EXT}$ can be detected based on monitoring a change in the Autler-Townes pair of transparency peaks in the frequency spectrum of the detection beam $OPT_{DET}$ (e.g., based on a change in the location of the Autler-Townes pair of transparency peaks in the frequency spectrum of the detection beam $OPT_{DET}$ relative to each other).

Referring back to the example of FIG. 2, the detection system 210 is configured to monitor the detection beam $OPT_{DET}$ to detect the external signal $RF_{EXT}$. In the example of FIG. 2, the detection system 210 includes a photodetector 218 (e.g., a photodiode) and a detection processor 220. The photodetector 218 can monitor the intensity and/or phase of the detection beam $OPT_{DET}$ and generate an electric signal, demonstrated in the example of FIG. 2 as a voltage VDET that corresponds to the intensity of the detection beam $OPT_{DET}$. As described above in the example of FIG. 4, the RF tuning signal $RF_{TN}$ can provide a defined pair of Autler-Townes frequency-spectrum transparency peaks associated with the alkali metal atoms in response to the RF tuning signal $RF_{TN}$ having a frequency that is approximately equal to the energy difference between the first and second Rydberg energy states |B> and |A>.

The detection processor 220 can thus determine a change in the pair of Autler-Townes frequency-spectrum transparency peaks that correspond to the presence of the external signal $RF_{EXT}$. For example, as described above, the tuning control signal CTRL can be implemented to adjust the RF tuning signal $RF_{TN}$ (e.g., with respect to frequency or intensity), resulting in adjustment of the mixed energy states |+> and |−>. Therefore, when the frequency of the external signal $RF_{EXT}$ is approximately equal to the energy difference between a third Rydberg energy state and one of the mixed energy states |+> and |−>, the Autler-Townes frequency-spectrum transparency peaks can exhibit a change that can be detected by the detection system 210. The detection processor 220 can thus determine characteristics associated with the external signal $RF_{EXT}$.

Figure 5:
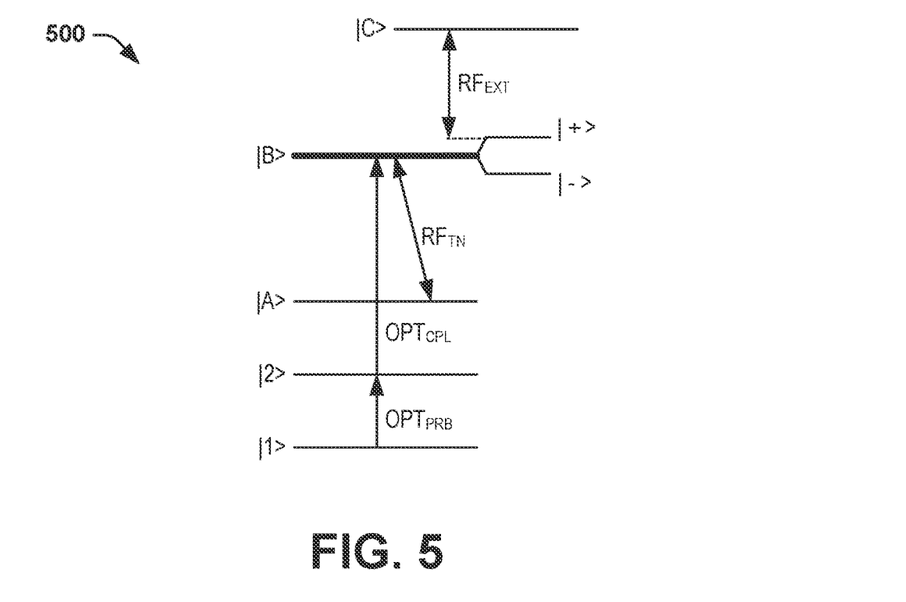
FIG. 5 illustrates an example of an energy state diagram.

FIG. 5 illustrates an example of an energy state diagram 500. The energy state diagram 500 can correspond to a first example of optical detection in the electrometer system 200. Therefore, reference is to be made to the example of FIG. 2 in the following description of the example of FIG. 5. As described above, the energy state diagram 500 can be applicable to detection of an external signal $RF_{EXT}$ that has a frequency that is greater than a predetermined threshold. The predetermined threshold can, for example, correspond to a frequency in which frequencies greater than the predetermined threshold can be detected based on the RF tuning signal $RF_{TN}$ having a sufficiently high frequency that the RF tuning signal $RF_{TN}$ can couple the first and second Rydberg states |B> and |A> in a well isolated manner, and thus without unintentional coupling to other Rydberg energy states resulting from non-uniformity of the electric field in the sensor cell 102.

The energy state diagram 500 demonstrates a first energy state (e.g., ground state) |1> at which the alkali metal atoms can begin. In response to the probe beam $OPT_{PRB}$, a population of the alkali metal atoms can be excited to a first excited state |2>. In response to the coupling beam $OPT_{CPL}$, a population of the excited alkali metal atoms can be further excited to a first Rydberg energy state |B>. Therefore, the alkali metal atoms in the first Rydberg energy state |B> can be transparent with respect to light at the approximate frequency of the probe beam $OPT_{PRB}$. The energy state diagram 500 includes a third Rydberg energy state |C>, and demonstrates an external signal $RF_{EXT}$ having a frequency relative to the third Rydberg energy state |C>. In the example of FIG. 5, the frequency of the external signal $RF_{EXT}$ is less than an energy difference between the first and third Rydberg energy states |B> and |C>. Therefore, the external signal $RF_{EXT}$ cannot be detectable absent the RF tuning signal $RF_{TN}$.

As described above, the RF tuning signal $RF_{TN}$ is provided through the sensor cell 202. In the example of FIG. 5, the RF tuning signal $RF_{TN}$ has a frequency that is approximately equal to an energy difference between the first Rydberg energy state |B> and a second Rydberg energy state |A>. As an example, the second Rydberg energy state |A> can have an energy that is significantly less than the first Rydberg energy state |B>, thereby requiring a relatively high frequency of the RF tuning signal $RF_{TN}$. The RF tuning signal $RF_{TN}$ results in the creation of the mixed energy states |+> and |−> that can each be based on a combination of the first and second Rydberg energy states. The mixed energy states |+> and |−> result in Autler-Townes splitting of the transparency peak of the alkali metal atoms in the frequency spectrum.

As also described above, the RF tuning signal $RF_{TN}$ can be tuned (e.g., by frequency or intensity) via the tuning control signal CTRL to adjust the mixed energy states |+> and |−>. As a first example, by adjusting the frequency of the RF tuning signal $RF_{TN}$ to detune the RF tuning signal $RF_{TN}$ from the energy difference between the first and second Rydberg energy states |B> and |A>, the mixed energy states |+> and |−> can be shifted up or down in the energy diagram. As a second example, by adjusting the intensity of the RF tuning signal $RF_{TN}$, the mixed energy states |+> and |−> can remain approximately centered on the first Rydberg energy state |B>, but the energy gap between the mixed energy states |+> and |−> can be increased or decreased. In the example of FIG. 5, by adjusting the RF tuning signal $RF_{TN}$, the energy difference between the third Rydberg energy state |C> and the mixed energy state |+> can be tuned to be approximately equal to the frequency of the external signal $RF_{EXT}$.

The examples of FIGS. 4 and 5 thus demonstrate a manner in which the external field $RF_{EXT}$ can be detected relative to the first and third Rydberg energy states based on the RF tuning field $RF_{TN}$ being resonant with the first and second Rydberg energy states. In this example, a given atom can be represented by three separate possible energies:

| | |
|---|---|
| $\|B, N_T, N_S\rangle$ | Energy 1 |
| $\|A, N_T - 1, N_S\rangle$ | Energy 2 |
| $\|C, N_T, N_S - 1\rangle$ | Energy 3 |

Where: $N_T$ represents photons associated with the RF tuning signal $RF_{TN}$ between the first and second Rydberg energy states; and $N_S$ represents photons associated with the external signal $RF_{EXT}$ between the first and third Rydberg energy states.

Energy 1 above therefore represents a first possibility of a given alkali metal atom, in which the alkali metal atom is excited to the first Rydberg energy state |B> and does not absorb any photons from the electromagnetic field. The photons $N_T$ and $N_S$ are between the first and second Rydberg energy states |B> and |A> and the first and third Rydberg energy states |B> and |C>, respectively. Energy 2 above therefore represents a second possibility of a given alkali metal atom, in which the alkali metal atom is initially excited to the first Rydberg energy state |B> and absorbs a photon $N_T$, thereby transitioning to the second Rydberg energy state |A>. Energy 3 above therefore represents a third possibility of a given alkali metal atom, in which the alkali metal atom is initially excited to the first Rydberg energy state |B> and absorbs a photon NS, thereby transitioning to the third Rydberg energy state |C>. Other possible atom plus field states are possible, but are suppressed for the simplicity of this description.

Based on the possibilities presented above by the Energies 1-3, and by setting Energy 1 as a reference energy (e.g., equal to zero), the frequency of the external signal $RF_{EXT}$ can be determined by a Hamiltonian matrix H, as expressed below:

$$H = \begin{pmatrix} \Delta_{LO} & \Omega_{LO}/2 & 0 \\ \Omega_{LO}/2 & 0 & \Omega_S/2 \\ 0 & \Omega_S/2 & -\Delta_S \end{pmatrix} \quad \text{Hamiltonian 1}$$

Where: $\Delta_{LO}$ is the detuning of the RF tuning signal $RF_{TN}$,
$\Delta_S$ is the detuning of the external RF signal $RF_{EXT}$,
$\Omega_{LO}/2$ is an amplitude of the electric field of the RF tuning signal $RF_{TN}$, and
$\Omega_S/2$ is an amplitude of the electric field of the external signal $RF_{EXT}$.

When the RF tuning signal has zero detuning $\Delta_{LO}=0$ and the external RF signal detuning is set to half of the Rabi frequency of the RF tuning signal $\Delta_S=\Omega_{LO}/2$, then Hamiltonian 1 can be expressed as follows:

$$H = \begin{pmatrix} 0 & \Omega_{LO}/2 & 0 \\ \Omega_{LO}/2 & 0 & \Omega_S/2 \\ 0 & \Omega_S/2 & \Omega_{LO}/2 \end{pmatrix} \quad \text{Hamiltonian 2}$$

Figure 6:
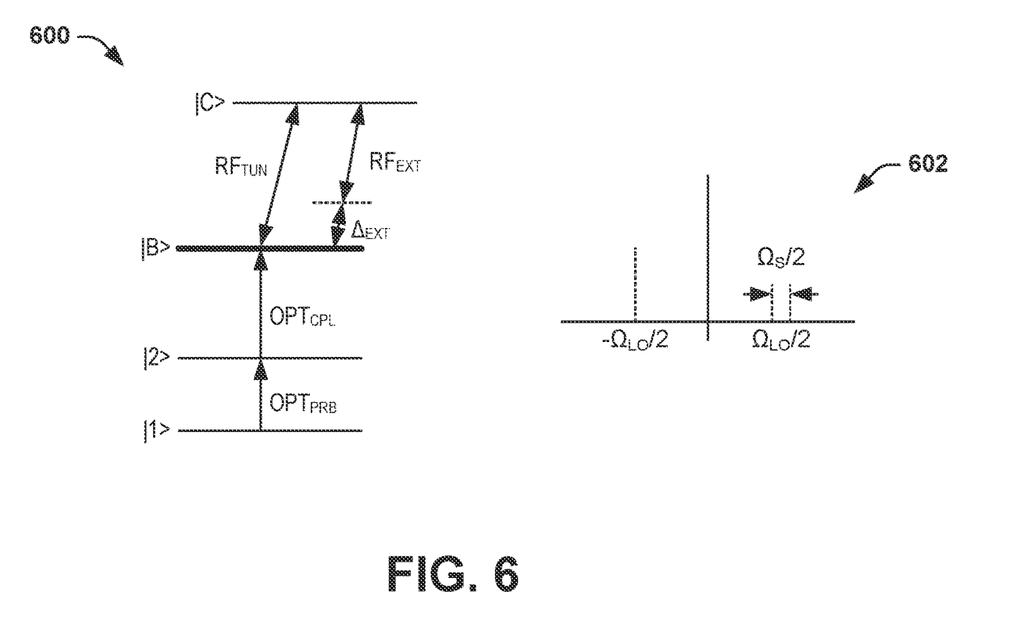
FIG. 6 illustrates another example of an energy state diagram.

FIG. 6 illustrates another example of an energy state diagram 600. The energy state diagram 600 can correspond to a second example of optical detection in the electrometer system 200. Therefore, reference is to be made to the example of FIG. 2 in the following description of the example of FIG. 6. By contrast to the example of FIG. 5, the energy state diagram 600 can be applicable to detection of an external signal $RF_{EXT}$ that has a frequency that is less than a predetermined threshold. Therefore, the energy state diagram 600 in the example of FIG. 6 can correspond to detection of a relatively low frequency external signal $RF_{EXT}$ based on the RF tuning signal $RF_{TN}$ having a sufficiently low frequency that the RF tuning signal $RF_{TN}$ can couple the first and second Rydberg states |B> and |A> without unintentional coupling to other Rydberg energy states based on an approximate uniformity of the electric field of the RF tuning signal $RF_{TN}$ in the sensor cell 102.

The energy state diagram 600 demonstrates a first energy state (e.g., ground state) |1> at which the alkali metal atoms can begin. In response to the probe beam $OPT_{PRB}$, a population of the alkali metal atoms can be excited to a first excited state |2>. In response to the coupling beam $OPT_{CPL}$, a population of the excited alkali metal atoms can be further excited to a first Rydberg energy state |A>. Therefore, the alkali metal atoms in the first Rydberg energy state |A> can be transparent with respect to light at the approximate frequency of the probe beam $OPT_{PRB}$. The energy state diagram 600 includes a second Rydberg energy state |C>, and demonstrates an external signal $RF_{EXT}$ having a frequency relative to the second Rydberg energy state |C>. In the example of FIG. 6, the frequency of the external signal $RF_{EXT}$ is less than an energy difference between the first and second Rydberg energy states |B> and |C> by a detuning amount $\Delta_{EXT}$. Therefore, the frequency of the external signal $RF_{EXT}$ is detuned from the energy difference between the first and second Rydberg energy states |B> and |C> by the detuning of the external signal $\Delta_{EXT}$. Accordingly, as described below, based on the detuning of the external signal $\Delta_{EXT}$, the external signal $RF_{EXT}$ cannot be detectable absent the RF tuning signal $RF_{TN}$.

While the Rydberg energy state |C> is described in the example of FIG. 6 as the second Rydberg energy state |C>, the second Rydberg energy state |C> in the example of FIG. 6 corresponds to the third Rydberg energy state |C> in the example of FIG. 5. Therefore, the second Rydberg energy state |C> in the example of FIG. 6 likewise refers to the Rydberg energy state that the external signal $RF_{EXT}$ is detected with reference to, such that the external signal $RF_{EXT}$ has a frequency between the first Rydberg energy state |B> and the second Rydberg energy state |C>, similar to as described in the example of FIG. 5. Therefore, as described herein, while the Rydberg energy state |C> is referred to as the third Rydberg energy state in the example of FIG. 5, and while the Rydberg energy state |C> is referred to as the second Rydberg energy state in the example of FIG. 6, the Rydberg energy states |C> are equivalent for purposes of detection of the external signal $RF_{EXT}$ in the examples of both FIGS. 5 and 6.

As described above, the RF tuning signal $RF_{TN}$ is provided through the sensor cell 202. In the example of FIG. 6, the RF tuning signal $RF_{TN}$ has a frequency that is approximately equal to an energy difference between the first Rydberg energy state |A> and a second Rydberg energy state |B>. For example, because the energy state diagram 600 is directed to detection of the external signal $RF_{EXT}$ that is less than the predetermined threshold, the wavelength of the RF tuning signal $RF_{TN}$ can be greater than twice the length of the sensor cell 202 to provide for uniformity of the electric field of the RF tuning signal $RF_{TN}$ within the sensor cell 202. Therefore, based on the higher wavelength of the RF tuning field $RF_{TN}$, the energy difference between the first and second Rydberg energy states |B> and |C> can be significantly less than an energy difference between the first and second Rydberg energy states |B> and |A> in the example of FIG. 5. Therefore, in the example of FIG. 6, the external signal $RF_{EXT}$ having a frequency between the first and second Rydberg energy states |B> and |C> can be detected based on setting the RF tuning signal $RF_{TN}$ resonant with the first and second Rydberg energy states |B> and |C>.

Similar to as described above in the example of FIG. 5, the RF tuning signal $RF_{TN}$ results in the creation of the mixed energy states that can be controlled based on an amplitude of the RF tuning signal $RF_{TN}$ (e.g., as set by the tuning control signal CTRL). An energy diagram is demonstrated at 602 in which the amplitude of the RF tuning signal $RF_{TN}$ is plotted, resulting in an approximate equivalent to the mixed energy states |+> and |−> in the example of FIG. 5. The energy diagram 602 includes a first amplitude $\Omega_{LO}/2$ and a second amplitude $-\Omega_{LO}/2$ of the electric field of the RF tuning signal $RF_{TN}$. The energy diagram 602 demonstrates a signal peak at the second amplitude $-\Omega_{LO}/2$ that can correspond approximately to the second Rydberg energy state |C>. The energy diagram 602 also demonstrates a pair of signal peaks at the first amplitude $\Omega_{LO}/2$ that can correspond approximately to the mixed energy states |+> and |−> in the example of FIG. 5. Therefore, by adjusting the power of the RF tuning signal $RF_{TN}$, the first amplitude $\Omega_{LO}/2$ can be set approximately equal to the power of the external signal $RF_{EXT}$, thereby relating the detuning of the external signal $\Delta_{EXT}$ to the Rabi frequency of the RF tuning signal $RF_{TN}$. Therefore, similar to the example of FIGS. 4 and 5, the mixed energy states in the energy state diagram 600 can result in Autler-Townes splitting of the transparency peak of the alkali metal atoms in the frequency spectrum, as described above.

The example of FIG. 6 thus demonstrates a manner in which the external field $RF_{EXT}$ can be detected relative to the first and second Rydberg energy states based on the RF tuning field $RF_{TN}$ being resonant with the first and second Rydberg energy states. In this example, a given atom can be represented by three separate possible energies:

| | |
|---|---|
| $\|B, N_T, N_S\rangle$ | Energy 4 |
| $\|C, N_T - 1, N_S\rangle$ | Energy 5 |
| $\|C, N_T, N_S - 1\rangle$ | Energy 6 |

The Energies 4-6 are similar to the Energies 1-3 in the example of FIG. 5 above. Particularly, Energy 4 above represents a first possibility of a given alkali metal atom, in which the alkali metal atom is excited to the first Rydberg energy state |B> and is unaffected by the photons $N_T$ and $N_S$ between the first and second Rydberg energy states. Energy 5 above represents a second possibility of a given alkali metal atom, in which the alkali metal atom is initially excited to the first Rydberg energy state |B> and absorbs a photon $N_T$, thereby transitioning to the second Rydberg energy state |C>. Energy 6 above therefore represents a third possibility of a given alkali metal atom, in which the alkali metal atom is initially excited to the first Rydberg energy state |B> and absorbs a photon NS, thereby transitioning to the second Rydberg energy state |C>.

Based on the possibilities presented above by the Energies 4-6, and by setting Energy 1 as a reference energy (e.g., equal to zero), the frequency of the external signal $RF_{EXT}$ can be determined by a Hamiltonian matrix H, as expressed below:

$$H = \begin{pmatrix} \Delta_{LO} & \Omega_{LO}/2 & 0 \\ \Omega_{LO}/2 & 0 & \Omega_S/2 \\ 0 & \Omega_S/2 & -\Delta_S \end{pmatrix}$$

$$H = \begin{pmatrix} \Delta_{LO} & \Omega_{LO}/2 & 0 \\ \Omega_{LO}/2 & 0 & \Omega_S/2 \\ 0 & \Omega_S/2 & -\Delta_S \end{pmatrix} \quad \text{Hamiltonian 3}$$

Where: $\Delta_{LO}$ corresponds to a detuning of the RF tuning signal $RF_{TN}$ from the energy difference between the first and second Rydberg energy states |B> and |C>; and $\Delta_S$ corresponds to the detuning of the external signal $\Delta_{EXT}$.

As described above, the power of the RF tuning signal $RF_{TN}$ can be adjusted to relate to the detuning of the external signal $\Delta_{EXT}$ to the Rabi frequency of the RF tuning signal $RF_{TN}$. Therefore, the Hamiltonian matrix H in Hamiltonian 3 can be modified by setting $\Delta_S$ equal to the second amplitude $-\Omega_{LO}/2$, as demonstrated at 602. Accordingly, the Hamiltonian matrix of Hamiltonian 3 can be expressed as follows:

$$H = \begin{pmatrix} 0 & \Omega_{LO}/2 & 0 \\ \Omega_{LO}/2 & 0 & \Omega_S/2 \\ 0 & \Omega_S/2 & \Omega_{LO}/2 \end{pmatrix} \quad \text{Hamiltonian 4}$$

Hamiltonian 4 therefore represents a Hamiltonian matrix that is identical to the Hamiltonian matrix in Hamiltonian 2. The adjustment of the power of the RF tuning signal $RF_{TN}$ has the equivalent effect of providing Autler-Townes splitting of the transparency peak of the intensity of the detection beam $OPT_{DET}$, similar to as described in the example of FIG. 4. Accordingly, the detection system 210 can detect the frequency of the external signal $RF_{EXT}$ in the same manner as described above in the example of FIG. 5.

Accordingly, as described herein, the electrometer system 200 can operate to detect a significantly broader range frequencies of the external signal $RF_{EXT}$ than a typical electrometer system. For example, if it is desired to detect an external signal $RF_{EXT}$ having a frequency that is above the predetermined threshold, the electrometer system 200 can implement the detection methodology described in the example of FIG. 5. However, if it is desired to detect an external signal $RF_{EXT}$ having a frequency that is below the predetermined threshold, the electrometer system 200 can implement the detection methodology described in the example of FIG. 6, and can thus detect an external signal $RF_{EXT}$ having a relatively low frequency without spuriously coupling of the RF tuning signal $RF_{TN}$ to undesired Rydberg energy states.

Figure 7:
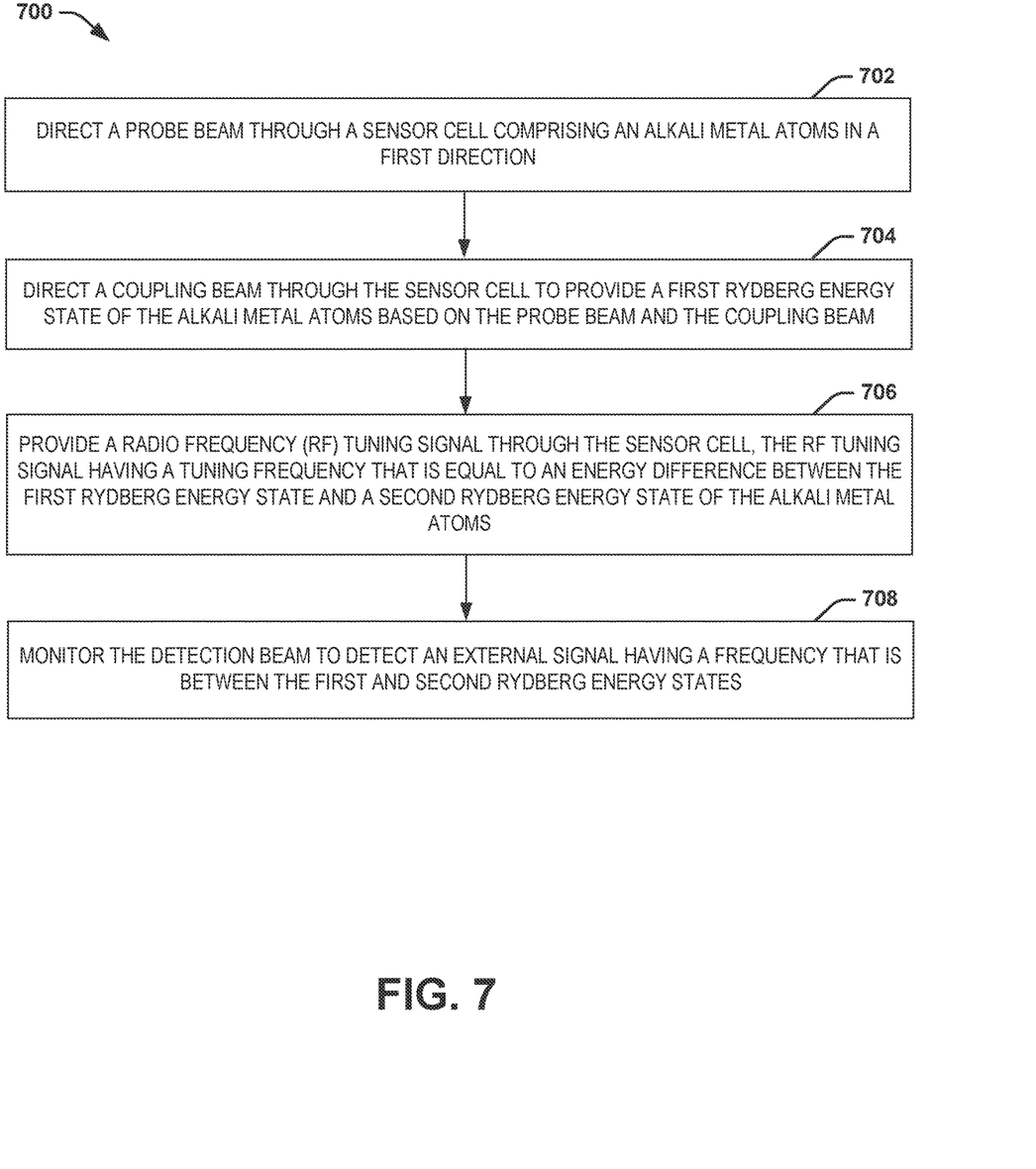
FIG. 7 illustrates a method for detecting an external signal via an electrometer system.

In view of the foregoing structural and functional features described above, a methodology in accordance with various aspects of the disclosure will be better appreciated with reference to FIG. 7. It is to be understood and appreciated that the method of FIG. 7 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 7 illustrates an example of a method 700 for detecting an external signal (e.g., the external signal $RF_{EXT}$) via an electrometer system (e.g., the electrometer system 100). At 702, a probe beam (e.g., the probe beam $OPT_{PRB}$) is directed through a sensor cell (e.g., the sensor cell 102) comprising an alkali metal atoms in a first direction. The probe beam can exit the sensor cell as a detection beam (e.g., the detection beam $OPT_{DET}$). At 704, a coupling beam (e.g., the coupling beam $OPT_{CPL}$) is directed through the sensor cell to provide a first Rydberg energy state of the alkali metal atoms based on the probe beam and the coupling beam. At 706, an RF tuning signal (e.g., the RF tuning signal $RF_{TN}$) having a tuning frequency that is equal to an energy difference between the first Rydberg energy state and a second Rydberg energy state of the alkali metal atoms is provided through the sensor cell. At 708, a detection beam (e.g., the detection beam $OPT_{DET}$) is monitored to detect the external signal having a frequency that is between the first and second Rydberg energy states.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An electrometer system comprising:
    a sensor cell comprising alkali metal atoms within;
    an optical beam system configured to provide at least one optical beam through the sensor cell to provide a first Rydberg energy state of the alkali metal atoms, the at least one optical beam exiting the sensor cell as a detection beam;
    a radio frequency (RF) tuning field generator configured to generate an RF tuning signal having a tuning frequency that is equal to an energy difference between the first Rydberg energy state and a second Rydberg energy state of the alkali metal atoms; and
    a detection system configured to monitor the detection beam to detect an external signal having a frequency that is between the first and second Rydberg energy states.

2. The system of claim 1, wherein the at least one optical beam is provided through the sensor cell along a length of the sensor cell, wherein the tuning frequency has a wavelength that is greater than twice the length of the sensor cell.

3. The system of claim 1, further comprising a waveguide extending along a length of the sensor cell, the waveguide being configured to propagate the RF tuning signal in the sensor cell.

4. The system of claim 3, wherein the waveguide extends within the sensor cell from a first end of the sensor cell through the sensor cell to a second end of the sensor cell opposite the first end.

5. The system of claim 1, wherein the RF tuning field generator is configured to adjust a power of the RF tuning signal, wherein the detection system is configured to determine the frequency of the external signal based on the power of the RF tuning signal.

6. The system of claim 5, wherein the power of the RF tuning signal is adjusted to relate a detuning of the external signal with respect to the energy difference between the first and second Rydberg energy states to a Rabi frequency of the RF tuning signal.

7. The system of claim 5, wherein the detection system is configured to determine the frequency of the external signal based on a Hamiltonian matrix associated with the power and frequency of the RF tuning signal.

8. The system of claim 1, wherein the RF tuning signal generator is configured to provide the tuning frequency of the RF tuning signal equal to the energy difference between the first and second Rydberg energy states of the alkali metal atoms, such that the detection system is configured to detect the external signal having the frequency that is less than the energy difference between the first and second Rydberg energy states, in response to the frequency of the external signal being less than a threshold,
    wherein the RF tuning signal generator is configured to provide the tuning frequency of the RF tuning signal equal to the energy difference between the first Rydberg energy state and a third Rydberg energy state of the alkali metal atoms to adjust the energy difference between the first and second Rydberg energy states, such that the detection system is configured to detect the external signal having the frequency that is between the energy difference of the first and second Rydberg energy states, in response to the frequency of the external signal being greater than the threshold.

9. The system of claim 1, wherein the optical beam system comprises:
    a probe laser configured to generate a probe beam directed through the sensor cell in a first direction, the probe beam exiting the sensor cell as the detection beam; and
    a coupling laser configured to generate a coupling beam directed through the sensor cell collinearly and anti-parallel with the probe beam to provide the first Rydberg energy state of the alkali metal atoms.

10. The system of claim 9, further comprising optics configured to collimate the probe beam and the coupling beam to provide the probe beam and the coupling beam to be collinear and anti-parallel with respect to each other, such that the detection system is configured to monitor the detection beam along an axis through the sensor cell to detect the external signal.

11. A method for detecting an external signal via an electrometer system, the method comprising:
    directing a probe beam through a sensor cell comprising an alkali metal atoms in a first direction, the probe beam exiting the sensor cell as a detection beam;
    directing a coupling beam through the sensor cell to provide a first Rydberg energy state of the alkali metal atoms based on the probe beam and the coupling beam;
    providing a radio frequency (RF) tuning signal through the sensor cell, the RF tuning signal having a tuning frequency that is equal to an energy difference between the first Rydberg energy state and a second Rydberg energy state of the alkali metal atoms; and
    monitoring the detection beam to detect the external signal having a frequency that is between the first and second Rydberg energy states.

12. The method of claim 11, wherein the probe and coupling beams are provided through the sensor cell along a length of the sensor cell, wherein the tuning frequency has a wavelength that is greater than twice the length of the sensor cell.

13. The method of claim 11, wherein the sensor cell comprises a waveguide extending along a length of the sensor cell, the waveguide being configured to propagate the RF tuning signal in the sensor cell.

14. The method of claim 11, further comprising adjusting a power of the RF tuning signal to relate a detuning of the external signal with respect to the energy difference between the first and second Rydberg energy states to a Rabi frequency of the RF tuning signal, the method further comprising determining the frequency of the external signal based on a Hamiltonian matrix associated with the power and frequency of the RF tuning signal.

15. The method of claim 11, wherein providing the RF tuning signal comprises:
    providing the RF tuning signal having the tuning frequency that is equal to the energy difference between the first Rydberg energy state and the second Rydberg energy state of the alkali metal atoms in response to the frequency of the external signal being less than a threshold; and
    providing the RF tuning signal having the tuning frequency that is equal to an energy difference between the first Rydberg energy state and a third Rydberg energy state of the alkali metal atoms to adjust the energy difference between the first and second Rydberg energy states in response to the frequency of the external signal being greater than the threshold.

16. An electrometer system comprising:
    a sensor cell comprising alkali metal atoms within;

a probe laser configured to provide a probe beam through the sensor cell in a first direction along a length of the sensor cell, the probe beam exiting the sensor cell as a detection beam;

a coupling laser configured to provide a coupling beam through the sensor cell to provide a first Rydberg energy state of the alkali metal atoms based on the probe beam and the coupling beam;

a radio frequency (RF) tuning field generator configured to generate an RF tuning signal having a tuning frequency that is equal to an energy difference between the first Rydberg energy state and a second Rydberg energy state of the alkali metal atoms and has a wavelength that is greater than twice the length of the sensor cell; and a detection system configured to monitor the detection beam to detect an external signal having a frequency that is between the first and second Rydberg energy states.

17. The system of claim 16, further comprising a waveguide extending along the length of the sensor cell, the waveguide being configured to propagate the RF tuning signal in the sensor cell.

18. The system of claim 16, wherein the RF tuning field generator is configured to adjust a power of the RF tuning signal to relate a detuning of the external signal with respect to the energy difference between the first and second Rydberg energy states to a Rabi frequency of the RF tuning signal.

19. The system of claim 18, wherein the detection system is configured to determine the frequency of the external signal based on a Hamiltonian matrix associated with the power and frequency of the RF tuning signal.

20. The system of claim 16, wherein the RF tuning signal generator is configured to provide the tuning frequency of the RF tuning signal equal to the energy difference between the first and second Rydberg energy states of the alkali metal atoms, such that the detection system is configured to detect the external signal having the frequency that is less than the energy difference between the first and second Rydberg energy states, in response to the frequency of the external signal being less than a threshold, wherein the RF tuning signal generator is configured to provide the tuning frequency of the RF tuning signal equal to the energy difference between the first Rydberg energy state and a third Rydberg energy state of the alkali metal atoms to adjust the energy difference between the first and second Rydberg energy states, such that the detection system is configured to detect the external signal having the frequency that is between the energy difference of the first and second Rydberg energy states, in response to the frequency of the external signal being greater than the threshold and having the wavelength that is less than twice the length of the sensor cell.

* * * * *